United States Patent
Lee

(10) Patent No.: US 7,566,645 B2
(45) Date of Patent: Jul. 28, 2009

(54) SEMICONDUCTOR DEVICE AND METHOD FOR FABRICATING THE SAME

(75) Inventor: Yu Jin Lee, Pohang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 203 days.

(21) Appl. No.: 11/819,858

(22) Filed: Jun. 29, 2007

(65) Prior Publication Data

US 2008/0023755 A1 Jan. 31, 2008

(30) Foreign Application Priority Data

Jul. 28, 2006 (KR) .................. 10-2006-0071553

(51) Int. Cl.
*H01L 21/3205* (2006.01)
*H01L 29/76* (2006.01)
(52) U.S. Cl. .................. 438/589; 438/270; 257/330; 257/332
(58) Field of Classification Search .............. 438/268, 438/270, 424, 585, 589, 592; 257/330, 332, 257/510
See application file for complete search history.

(56) References Cited

U.S. PATENT DOCUMENTS

| 5,915,192 | A | * | 6/1999 | Liaw et al. .................. 438/435 |
| 6,313,008 | B1 | * | 11/2001 | Leung et al. ................. 438/424 |
| 6,716,757 | B2 | * | 4/2004 | Lin et al. ..................... 438/705 |
| 6,869,884 | B2 | * | 3/2005 | Chan et al. ................... 438/705 |
| 7,339,253 | B2 | * | 3/2008 | Tsai et al. .................... 257/522 |
| 2006/0049455 | A1 | | 3/2006 | Jang et al. |
| 2007/0032037 | A1 | * | 2/2007 | Yang et al. .................. 438/424 |

FOREIGN PATENT DOCUMENTS

| JP | 2006-190947 | 7/2006 |
| KR | 10-2007-0017787 | 2/2007 |

* cited by examiner

*Primary Examiner*—Kevin M Picardat
(74) *Attorney, Agent, or Firm*—Finnegan, Henderson, Farabow, Garrett & Dunner, L.L.P.

(57) ABSTRACT

A method for fabricating a semiconductor device is provided. In the method, a bulb type recess is formed on a semiconductor substrate in an active region. A gate insulating film is formed over the semiconductor substrate and on a surface of the recess. A first polysilicon layer is formed over the gate insulating film. A silicon-on-dielectric ("SOD") barrier film is formed on the first polysilicon layer at a lower part of the recess. A second polysilicon layer is formed over the semiconductor substrate and filling the recess. Impurity ions are injected into the second polysilicon layer. An annealing process is performed on the semiconductor substrate. A metal layer and a gate hard mask layer is formed and patterned over the second polysilicon layer to form a gate including the SOD barrier film.

18 Claims, 6 Drawing Sheets

SEMICONDUCTOR DEVICE AND METHOD FOR FABRICATING THE SAME

I. CROSS-REFERENCES TO RELATED APPLICATIONS

The present application claims the benefit of priority to Korean patent application number 10-2006-0071553, filed on Jul. 28, 2006, the entire contents of which are incorporated herein by reference.

II. BACKGROUND

The invention relates to memory devices. More particularly, the invention relates to a semiconductor device comprising a dual poly gate and a method for fabricating the same.

As the design rules of semiconductor devices shrink, it is difficult to control Short Channel Effects (SCE). Accordingly, Multi-channel Field Effect Transistors (McFET), such as a recessed channel transistor and a fin channel transistor, have been proposed to increase the channel length of a cell transistor.

III. SUMMARY

Embodiments consistent with the invention are directed to a dual poly gate in a semiconductor device. According to one embodiment, the dual poly gate includes a Silicon-on-Dielectric ("SOD") barrier film.

According to one embodiment, a method for fabricating a semiconductor device includes forming a device isolation structure in a semiconductor substrate to define an active region, forming a bulb type recess on the semiconductor substrate in the active region, forming a gate insulating film over the semiconductor substrate and on a surface of the recess, forming a first polysilicon layer over the gate insulating film, forming a silicon-on-dielectric ("SOD") barrier film on the first polysilicon layer at a lower part of the recess, forming a second polysilicon layer over the semiconductor substrate and filling the recess, injecting impurity ions into the second polysilicon layer, performing an annealing process on the semiconductor substrate, and forming and patterning a metal layer and a gate hard mask layer over the second polysilicon layer to form a gate including a stacked structure having a gate hard mask pattern, the metal layer, the second polysilicon layer, the SOD barrier film, and the first polysilicon layer.

According to another embodiment, a semiconductor device including the dual poly gate may be fabricated according to the method described above.

IV. BRIEF DESCRIPTION OF THE DRAWINGS

Figure 1:
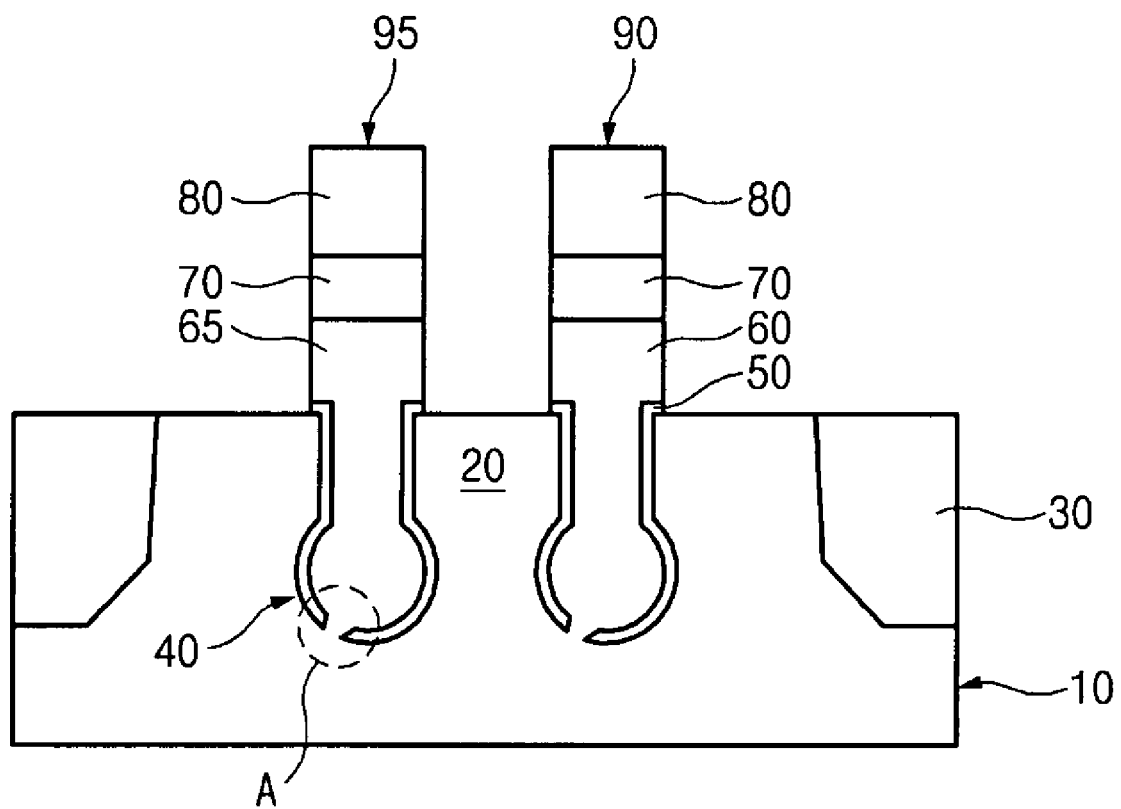

FIG. 1 is a cross-sectional view illustrating a method for fabricating a semiconductor device; and FIGS. 2a through 2i are cross-sectional views illustrating a method for fabricating a semiconductor device according to an embodiment consistent with the invention.

V. DETAILED DESCRIPTIONS

The invention relates to a semiconductor device having an improved dual poly gate. According to one embodiment consistent with the invention, the improved dual poly gate includes a Silicon-on-Dielectric (SOD) barrier film to prevent a poly seam from being generated in a recess.

FIG. 1 is a cross-sectional view illustrating a method for fabricating a semiconductor device. The semiconductor device includes a semiconductor substrate 10, a device isolation structure 30, a bulb-type recess 40, and gates 90 and 95. Device isolation structure 30 is formed in semiconductor substrate 10 to define an active region 20. Bulb-type recess 40 is formed in semiconductor substrate 10 in active region 20. A gate oxide film 50 is formed over semiconductor substrate 10 and in recess 40. A gate polysilicon layer (not shown) may be formed over semiconductor substrate 10 to fill recess 40.

A first photoresist pattern (not shown), which covers a region to be formed as a P-type gate, may be formed over semiconductor substrate 10. An N-type impurity ion-implanting process is performed using the first photoresist pattern as a mask on a polysilicon layer of a region to be formed as an N-type gate region, thereby forming an N-type polysilicon layer 60. Then, the first photoresist pattern is removed.

A second photoresist pattern (not shown), which covers a region to be formed as an N-type gate, is formed over semiconductor substrate 10. A p-type impurity ion-implanting process is performed using the second photoresist pattern as a mask on a polysilicon layer of a region to be formed as a P-type gate region. Then, the second photoresist pattern is removed.

An annealing process is performed to diffuse the N-type and P-type impurity ions into the polysilicon layer of the lower recess. A metal layer 70 and a gate hard mask layer 80 are formed respectively over N-type and P-type polysilicon layers 60 and 65. Gate hard mask layer 80, metal layer 70, and polysilicon layers 60 and 65 are patterned using a gate mask as an etching mask to form a dual poly gate including an N-type gate 90 having N-type polysilicon layer 60 and a P-type gate 95 having P-type polysilicon layer 65.

A poly seam may be generated on a polysilicon layer when filling a bulb-type recess. In the anneal process, the poly seam may move into gate oxide film 50. The movement of the poly seam may occur depending on the impurity concentration of the polysilicon layer, the deposition temperature, and the anneal process. The moved poly seam may affect gate oxide film 50 (see 'A'). The existence of the poly seam in gate oxide film 50 may change a gate threshold voltage, thereby degrading the electric characteristics of the semiconductor device.

FIGS. 2a through 2i are cross-sectional views illustrating a method for fabricating a semiconductor device according to an embodiment consistent with the invention. In the semiconductor device fabricated according to FIGS. 2a through 2i, the poly seam in recess 40 of FIG. 1 may be prevented to improve electric characteristics of the semiconductor device.

Figure 2A:
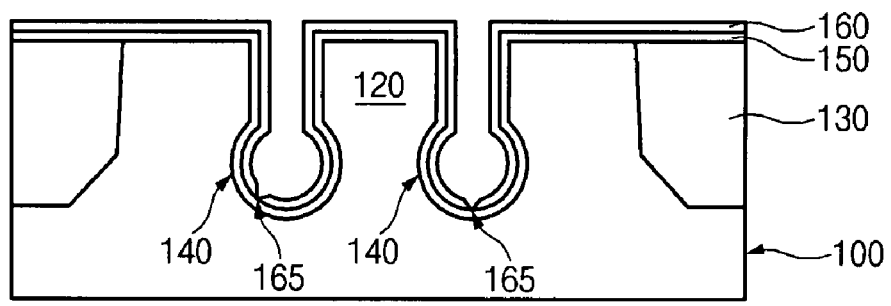

Referring to FIG. 2a, a device isolation structure 130 is formed in a semiconductor substrate 100 to define an active region 120. A well ion-implanting process is performed on semiconductor substrate 100 in active region 120. In one embodiment, two bulb-type recesses 140 may be formed in active region 120 to divide active region 120 into three sections in a longitudinal direction of active region 120. A portion of semiconductor substrate 100 corresponding to an overlapping region of active region 120 and a gate region is selectively etched to form a first recess as a neck part of a bulb type recess. An oxide spacer (not shown) is formed over a sidewall of the first recess. An isotropic etching process is performed on semiconductor substrate 100 at the bottom of the first recess to form a second recess as a lower part of the bulb type recess. The oxide spacer is removed to form a bulb type recess defined by the first recess and the second recess. A gate insulating film 150 is formed over semiconductor substrate 100 and on a surface of recess 140. A first polysilicon layer 160 is formed over gate insulating film 150.

Device isolation structure 130 is formed by a High Density Plasma ("HDP") process using a Shallow Trench Isolation ("STI") method. The depth of recess 140 is in a range of about 400 to 4,000 Å from the top surface of semiconductor substrate 100. Gate insulating film 150 may include an oxide film that has a thickness in a range of about 30 to 100 Å. A nitride plasma process may be subjected to gate insulating film 150. As a result, impurity ions may not be penetrated into gate insulating film 150 in the subsequent impurity ion-implanting process.

The thickness of first polysilicon layer 160 is in a range of about 100 to 300 Å. A poly seam 165, which may be a fine void, can be formed in first polysilicon layer 160. Poly seam 165 is shown in or on first polysilicon layer 160.

Figure 2B:
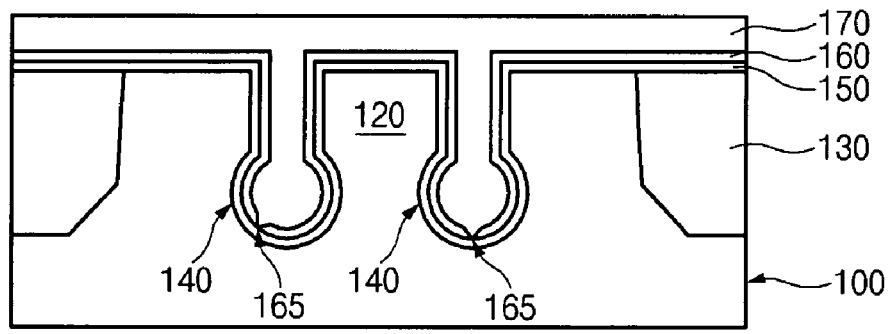
Figure 2C:
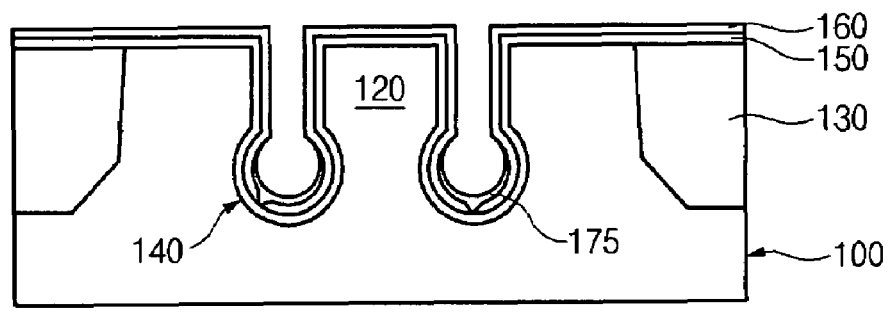

Referring to FIGS. 2b and 2c, a Silicon-on-Dielectric ("SOD") layer 170 is formed over semiconductor substrate 100 and in recess 140. A SOD layer having a good fluidity can fill poly seam 165 generated in first polysilicon layer 160. SOD layer 170 is wet-etched to form an SOD barrier film 175 on first polysilicon layer 160 at the bottom of recess 140. Adverse effects resulting from poly seam 165 generated on first polysilicon layer 160 is prevented by SOD barrier film 175, which effectively fills in poly seam 165. A second polysilicon layer 180 is formed over semiconductor substrate 100 and filling recess 140.

SOD layer 170 has a thickness ranging from about 1,000 to 3,000 Å. The wet-etching process for SOD layer 170 may be performed by one cleaning process selected from the group consisting of BFN 390", BFN 70", and combination thereof. The thickness of second polysilicon layer 180 is in a range of about 500 to 1,000 Å.

Figure 2D:
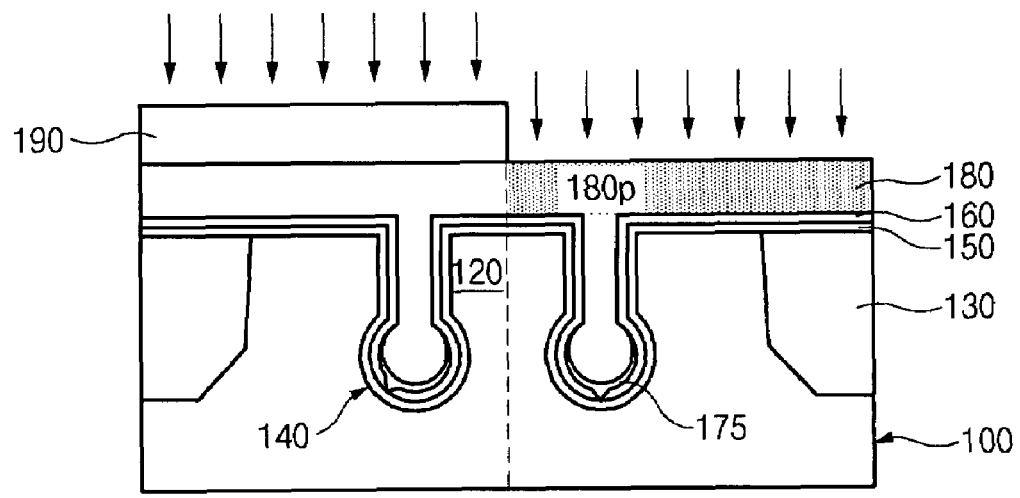
Figure 2E:
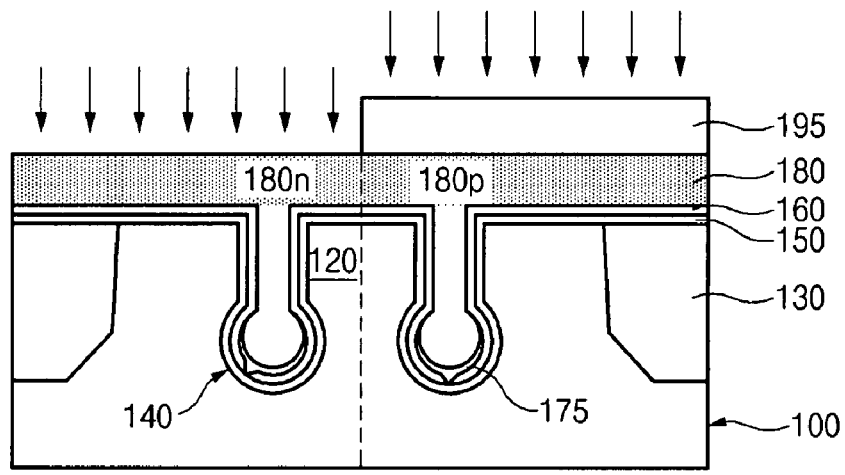

Referring to FIGS. 2d and 2e, a first ion-implanting mask pattern 190 is formed on a portion of second polysilicon layer 180. A P-type impurity ion-implanting process is performed on the exposed portion of second polysilicon layer 180 not covered by first ion-implanting mask pattern 190 forming a P-type polysilicon layer 180p exposing second polysilicon layer 180. First ion-implanting mask pattern 190 is then removed. A second ion-implanting mask pattern 195 is formed over P-type polysilicon layer 180p. An N-type impurity ion-implanting process is performed on exposed second polysilicon layer 180 to form an N-type polysilicon layer 180n.

A P type impurity ion is selected from the group consisting of B, Ga, In, and combinations thereof. An N type impurity ion is selected from the group consisting of As, Sb, P, and combinations thereof.

Figure 2F:
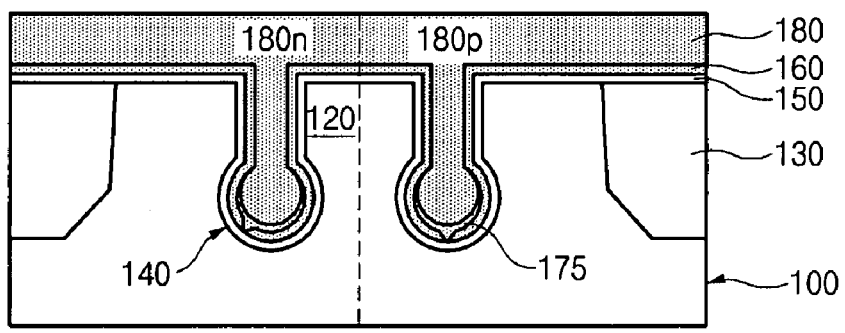
Figure 2G:
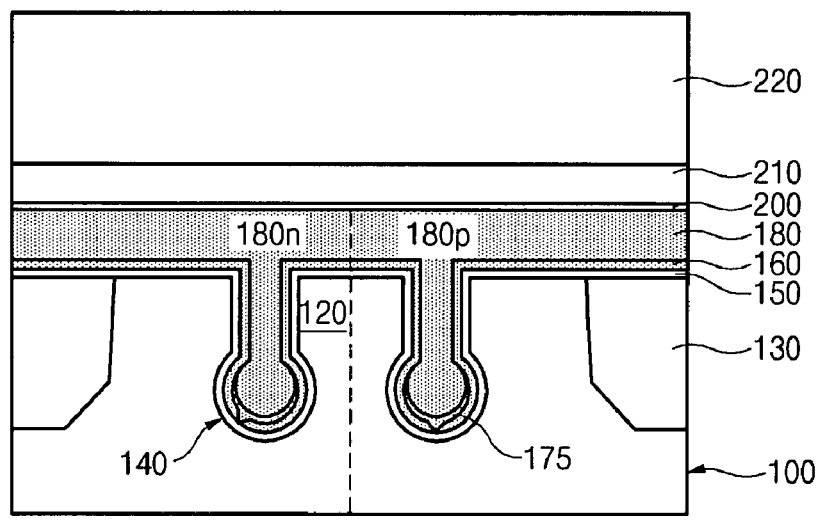

Referring to FIGS. 2f and 2g, second ion-implanting mask pattern 195 is removed. An anneal process is performed on semiconductor substrate 100. The anneal process is performed so that P-type and N-type impurity ions are diffused into an interface between first polysilicon layer 160 and gate insulating film 150. Due to SOD barrier film 175, second polysilicon layer 180 is not connected to active region 120 or device isolation structure 130. A metal layer 210 and a gate hard mask layer 220 are formed over second polysilicon layer 180.

A diffusion preventing film 200 is further formed to prevent impurity ions from diffusing at the interface between second polysilicon layer 180 and metal layer 210. The thickness of diffusion preventing film 200 is in a range of about 50 to 100 Å. The thickness of metal layer 210 is in a range of about 300 to 400 Å. The thickness of gate hard mask layer 220 is less than about 3,000 Å.

Figure 2H:
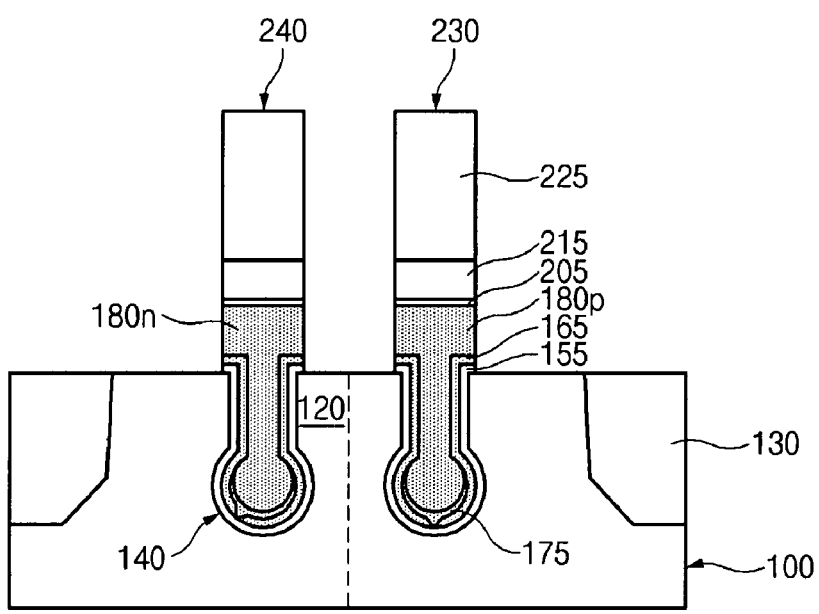
Figure 2I:
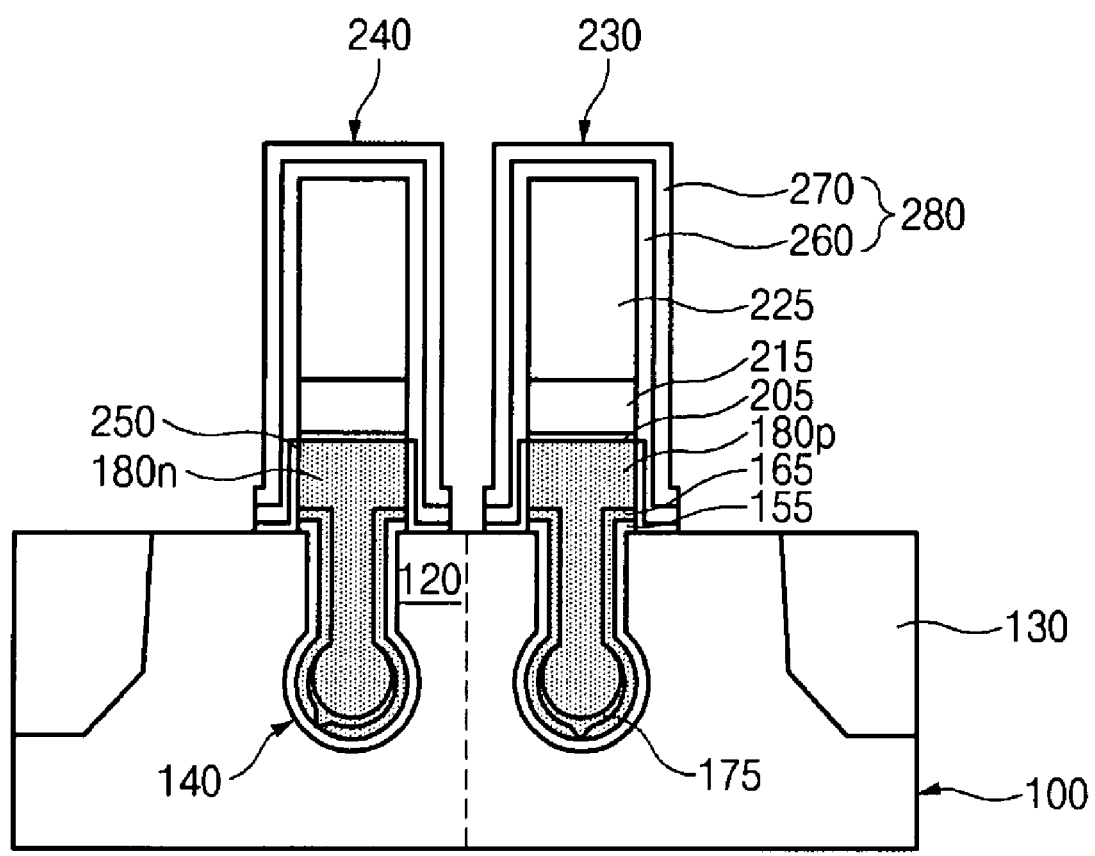

Referring to FIGS. 2h and 2i, a dry etching process is performed on gate hard mask layer 220, metal layer 210, second polysilicon layer 180, first polysilicon layer 160, and gate insulating film 150, using a gas mask (not shown) as an etching mask, to form gates 230 and 240 in a stacked structure. Gate 240 may be an N-type gate having N-type polysilicon layer 180n, and gate 230 may be a P-type gate having P-type polysilicon layer 180p. A thermal oxide film 250 is formed over active region 120 and on sidewalls of first and second polysilicon layers 160 and 180. A buffer oxide film 260 and a nitride film 270 are formed over semiconductor substrate 100 and on gates 230 and 240. A dry etching process is performed on nitride film 270, buffer oxide film 260, and thermal oxide film 250 to form a gate spacer 280.

According to an embodiment consistent with the invention, the thickness of thermal oxide film 250 ranges from about 20 to 150 Å. The thickness of buffer oxide film 260 is in a range of about 50 to 200 Å. The thickness of nitride film 270 is in a range of about 50 to 200 Å. The thickness of gate spacer 280 is in a range of about 50 to 600 Å.

As described above, in a semiconductor device and a method for fabricating the same according to an embodiment consistent with the invention, SOD barrier film 175 is formed in a gate electrode to prevent degradation of a gate insulating film, thereby improving electric characteristics and yield of the semiconductor device.

The above embodiments consistent with the invention are illustrative and not limitative. Various alternatives and equivalents are possible. The invention is not limited by the type of deposition, etching, polishing, and/or patterning steps described herein. Nor is the invention limited to any specific types of semiconductor devices. For example, the invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for fabricating a semiconductor device, the method comprising:
    forming a device isolation structure in a semiconductor substrate to define an active region;
    forming a bulb type recess on the semiconductor substrate within the active region;
    forming a gate insulating film over the semiconductor substrate and on a surface of the bulb type recess;
    forming a first polysilicon layer over the gate insulating film;
    forming a silicon-on-dielectric ("SOD") barrier film over the first polysilicon layer at a lower part of the bulb type recess;
    forming a second polysilicon layer over the semiconductor substrate and filling the bulb type recess;
    injecting impurity ions into the second polysilicon layer;
    performing an annealing process on the semiconductor substrate; and
    forming and patterning a metal layer and a gate hard mask layer on the second polysilicon layer to form a gate including a stacked structure having a gate hard mask pattern, the metal layer, the second polysilicon layer, the SOD barrier film, and the first polysilicon layer.

2. The method of claim 1, wherein forming the bulb type recess further comprises:
    etching a portion of the semiconductor substrate corresponding to a portion of the active region overlapping the gate to form a first recess as a neck part of the bulb type recess;
    forming an oxide spacer over a sidewall of the first recess;

performing an isotropic etching process on the semiconductor substrate at the bottom of the first recess to form a second recess as a lower part of the bulb type recess; and removing the oxide spacer to form the bulb type recess defined by the first recess and the second recess.

3. The method of claim 1, wherein a depth of the bulb type recess is in a range of about 400 to 4,000 Å from a top surface of the semiconductor substrate.

4. The method of claim 1, wherein a thickness of the gate insulating film is in a range of about 30 to 100 Å.

5. The method of claim 1, wherein a thickness of the first polysilicon layer is in a range of about 100 to 300 Å.

6. The method of claim 1, wherein forming the SOD barrier film further comprises:
    forming an SOD layer over the first polysilicon layer; and
    performing a wet-etching process on the SOD layer to form the SOD barrier film over the first polysilicon layer at the lower part of the bulb type recess.

7. The method of claim 1, wherein a thickness of the SOD layer is in a range of about 1,000 to 3,000 Å.

8. The method of claim 6, wherein the wet-etching process for the SOD layer is performed by one cleaning process selected from the group consisting of BFN 390", BFN 70", and combination thereof.

9. The method of claim 1, wherein a thickness of the second polysilicon layer is in a range of about 500 to 1,000 Å.

10. The method of claim 1, wherein a P-type impurity ion is selected from the group consisting of B, Ga, In, and combinations thereof, and an N-type impurity ion is selected from the group consisting of As, Sb, P, and combinations thereof.

11. The method of claim 1, wherein performing the annealing process diffuses the impurity ions into the interface between the first polysilicon layer and the gate insulating film.

12. The method of claim 1, wherein a thickness of the metal layer is in a range of about 300 to 400 Å.

13. The method of claim 1, further comprising:
    forming a thermal oxide film over the active region including a sidewall of the first polysilicon layer and the second polysilicon layer;
    forming a stacked structure of a buffer oxide film and a nitride film over the semiconductor substrate and on the gate; and
    performing a dry etching process on the nitride film, the buffer oxide film, and the thermal oxide film to form a gate spacer over a sidewall of the gate.

14. The method of claim 13, wherein a thickness of the thermal oxide film is in a range of about 20 to 150 Å.

15. The method of claim 13, wherein a thickness of the buffer oxide film is in a range of about 50 to 200 Å.

16. The method of claim 13, wherein a thickness of the nitride film is in a range of about 50 to 200 Å.

17. The method of claim 13, wherein a thickness of the gate spacer is in a range of about 50 to 600 Å.

18. A semiconductor device manufactured according to the method recited in claim 1.

* * * * *